(12) United States Patent
Agarwal et al.

(10) Patent No.: US 7,598,816 B2
(45) Date of Patent: Oct. 6, 2009

(54) PHASE LOCK LOOP CIRCUIT WITH DELAYING PHASE FREQUENCY COMPARSON OUTPUT SIGNALS

(75) Inventors: Nitin Agarwal, Noida (IN); Kallol Chatterjee, Noida (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 114 days.

(21) Appl. No.: 11/638,306

(22) Filed: Dec. 12, 2006

(65) Prior Publication Data

US 2007/0229175 A1    Oct. 4, 2007

(30) Foreign Application Priority Data

Dec. 20, 2005   (IN)  .................. 3412/DEL/2005

(51) Int. Cl.
*H03L 7/08*   (2006.01)
(52) U.S. Cl. ........................... 331/17; 331/16

(58) Field of Classification Search .......... 331/16, 331/17
See application file for complete search history.

(56) References Cited

U.S. PATENT DOCUMENTS

| 6,420,917 | B1 | 7/2002 | Klemmer | |
|---|---|---|---|---|
| 2006/0012438 | A1* | 1/2006 | Chou et al. | 331/16 |
| 2007/0052489 | A1* | 3/2007 | Ballantyne et al. | 331/17 |

* cited by examiner

*Primary Examiner*—Joseph Chang
(74) *Attorney, Agent, or Firm*—Gardere Wynne Sewell LLP

(57) ABSTRACT

A phase locked loop (PLL) circuit includes circuitry for preventing an erroneous condition in charge pump operation. The PLL circuit is modified by adding delay elements for connection between the phase frequency detector and the charge pump. A digital logic circuit is also included to provide the clock signals for the loop filter wherein the clock signals have rising edges corresponding to an earlier occurring rising edge of either of the output signals from the phase-frequency detector.

14 Claims, 2 Drawing Sheets

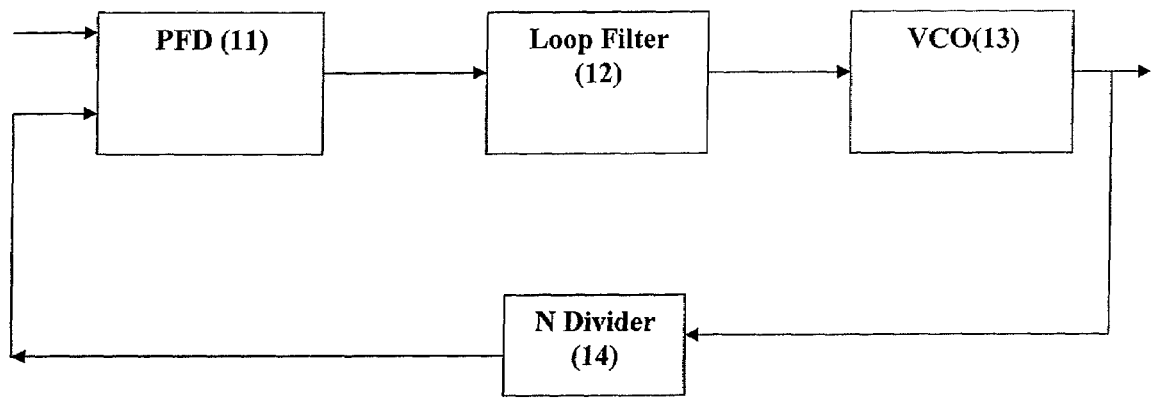
Figure 1 *(Prior Art)*
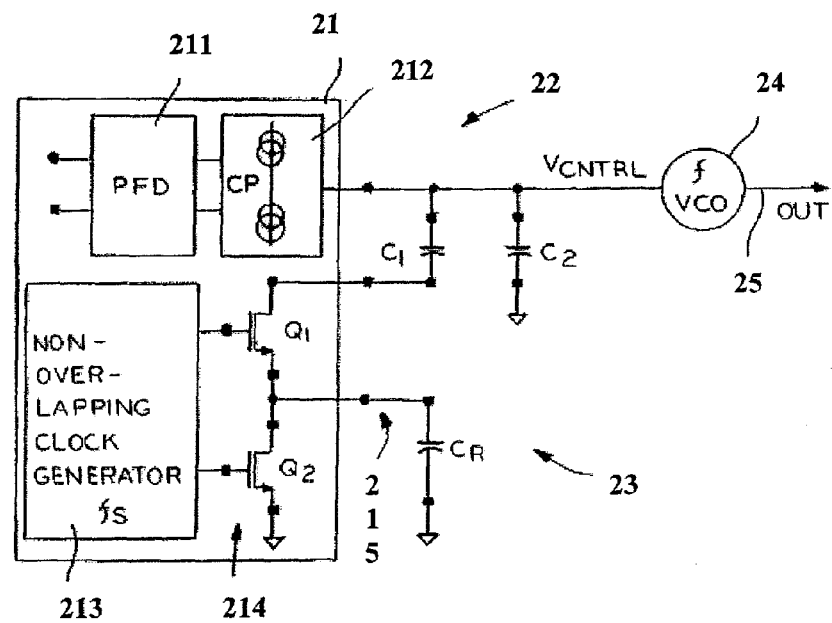
Figure 2 *(Prior Art)*

PHASE LOCK LOOP CIRCUIT WITH DELAYING PHASE FREQUENCY COMPARSON OUTPUT SIGNALS

PRIORITY CLAIM

The present application claims priority from Indian Application for Patent No. 3412/Del/2005 filed Dec. 20, 2005, the disclosure of which is hereby incorporated by reference.

BACKGROUND OF THE INVENTION

1. Technical Field of the Invention

The present invention relates to an improved phase locked loop circuit. More particularly, the instant invention relates to correcting an error condition in the operation of switched capacitor resistance based phase locked loops.

2. Description of Related Art

Phase locked loop (PLL) circuits are used in circuits that require high frequency clock signals. In these circuits, usually the frequency of the clock signal is a multiple of the frequency of a stable low-noise reference signal. PLL circuits are also used in applications where constant tracking of the reference signal is required for the output signal.

PLL circuits are commonly used in transmitters and receivers for locally generating signals for these devices. These signals are commonly used for extracting the channel information at the receiver end. PLL circuits are also used for clock recovery in communication systems, disk drives, etc. Another common application for PLL circuits is found in modulation and demodulation of frequency modulated signals.

A conventional PLL circuit is illustrated in FIG. 1. A conventional PLL comprises a phase frequency detector (PFD) 11, a loop filter 12, a voltage controlled oscillator (VCO) 13 and an N Divider 14. The PFD 11 device receives two inputs and generates an output which represents the phase difference between the two input signals. The first input to the PLL is the external reference input RFCLK on one terminal and while the second input applied to the other port receives the feedback signal FBCLK derived from the final output of the PLL. The output of the PFD 11 is used as the input for a loop filter 12. At this point the filtered output is a DC signal which is fed to the VCO 13. The control input of the VCO 13 is a measure of input frequency and the output of the VCO is a locally generated periodic signal with a frequency which is usually a multiple of the input signal RFCLK. A divider circuit N 14 is provided for the feedback path to produce the feedback signal FBCLK and define the multiplicity of input frequency with respect to the output.

FIG. 2 describes a widely used switched capacitor resistor PLL as shown in U.S. Pat. No. 6,420,917, the disclosure of which is hereby incorporated by reference. The PLL comprises a phase frequency detector 211, a charge pump 212, a loop filter 22 and a voltage controlled oscillator (VCO) 24. Note that the feedback loop of the PLL is not illustrated in FIG. 2. The loop filter 22 is used for connecting the output of the phase frequency detector 211 to a VCO 24. The output of the VCO 24 is the output of the PLL circuit. This is fed back to the phase frequency detector 211 through a divider circuit (not shown). The loop filter 22 is designed to meet the stability criteria so the loop does not enter an oscillatory condition. Different resistive devices are inserted into the loop filter to result is stabilization of the loop. A simple resistor results in excessive background thermal noise.

U.S. Pat. No. 6,420,917 introduces an idea for implementing the passive resistor in the PLL loop filter 22 by using a switched capacitor circuit. As noted in the patent, the sampling clock of this switched capacitor resistor has to be of a frequency which is higher than the PLL loop bandwidth for the switched capacitor resistor to accurately match an equivalent passive resistor. The Patent does not talk about the way in which this sampling clock can be generated. Further, there needs to be a definite phase relationship between this sampling clock and the input clock to the PLL. This relationship is important from the point of view of locking behavior of the PLL when the PLL starts from zero initial voltage at its various internal nodes.

More particularly, if FBCLK leads REFCLK at a particular instant, the state of the switched capacitor circuit would not change until the rising edge of REFCLK, but the charge pump would, depending on the phase difference between FBCLK and REFCLK, remove charge from the loop filter 22. This is an erroneous condition, because after the charge has been removed from the loop filter and before the voltages in the loop filter 22 can settle to their final values, the state of the switched capacitor circuit would change to the other configuration. Ideally, the state of the switched capacitor circuit should change first and only then should the charge be removed from the loop filter 22. If REFCLK leads FBCLK at a particular instant, there would be a finite time delay for the non-overlapping clock generator 213 to generate the required clocks for the switched capacitor resistor. But, if within this delay, the charge pump 212 delivers charge pump to the loop filter 22, it would again be an erroneous condition. This is because the configuration of the switched capacitor circuit when the charge pump 212 delivers charge is the previous configuration. Ideally, the charge should be delivered to the loop filter 22 only after the new configuration of the switched capacitor circuit has been set.

Hence, there is need for a loop filter circuit that will lead to the avoidance of the erroneous condition in the charge pump. There is also need for a circuit for generating the sampling clock in the PLL circuit. There is further need for an improved phase locked loop circuit which addresses the aforesaid drawbacks of the prior art. There is also a need to provide a loop filter for a PLL that will lead to the avoidance of the erroneous condition in the charge pump. There is also a need to provide a circuit for generating the sampling clock in the PLL.

SUMMARY OF THE INVENTION

In an embodiment, a phase-locked loop circuit comprises a phase-frequency detector for comparing the input signal with a feedback signal, a charge pump controlled by control outputs from said phase-frequency detector, a switched-capacitor resistance based loop filter connected to the output of said charge pump, a voltage controlled oscillator connected to the output of said switched-capacitor resistance based loop filter with its output providing said feedback signal, and a sampling clock for driving said switched-capacitor resistance. Delay elements are introduced between said control outputs from said phase-frequency detector and the control inputs of said charge pump. Said sampling clock includes a set of non-overlapping clocks generated by a non-overlapping clock generator, and said non-overlapping clock generator is connected to a digital logic circuit that generates an output signal whose rising edges correspond to the earlier occurring rising edge of either of said control outputs from said phase-frequency detector.

The control outputs are UP and DN signals.

The delay elements are 2-input OR gates; each said OR gate having both inputs coupled to each said control outputs from said phase-frequency detector.

The digital logic circuit is a 2-input OR gate having its inputs connected to said control outputs from said phase-frequency detector.

In embodiment, a method for phase locking comprises comparing the input signal with a feedback signal, generating control outputs from a phase-frequency detector, providing control outputs to a charge pump, filtering the output of said charge pump, and providing said feedback signal with respect to output of said filtering. Furthermore, the method comprises delaying said control outputs from said phase-frequency detector to said charge pump, generating a set of non-overlapping clocks by a non-overlapping clock generator, and generating an output signal whose rising edges corresponds to the earlier occurring rising edge of either of said control outputs from said phase-frequency detector.

In an embodiment, a phase-locked loop circuit comprises a voltage controlled oscillator receiving a voltage control input and generating an oscillating output signal, a phase-frequency detector generating a first and second control output responsive to a comparison of a reference frequency signal to a feedback signal derived from the oscillating output signal, first and second delay circuits operable to delay the first and second control outputs, a charge pump circuit responsive to the delayed first and second control outputs to generate a control voltage, a switched capacitor-type loop filter receiving the control voltage and outputting the voltage control input, and a switching control circuit responsive to the first and second control outputs to generate signals for controlling operation of the switched capacitor-type loop filter.

In another embodiment, a phase-locked loop circuit comprises a voltage controlled oscillator receiving a voltage control input and generating an oscillating output signal, a phase-frequency detector generating a first and second control output responsive to a comparison of a reference frequency signal to a feedback signal derived from the oscillating output signal, a charge pump circuit responsive to the first and second control outputs to generate a control voltage, a switched capacitor-type loop filter receiving the control voltage and outputting the voltage control input, and a switching control circuit responsive to the first and second control outputs to generate signals for controlling operation of the switched capacitor-type loop filter.

In another embodiment, a method for phase locking comprises delaying first and second phase frequency comparison output signals prior to application to a charge pump circuit which outputs a control voltage, loop filtering the control voltage with a switched capacitor-type loop filter to generate a voltage controlled oscillator control input signal, and generating clock signals driving operation of the switched capacitor-type loop filter wherein the generated clock signals are derived from the first and second phase frequency comparison output signals.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 illustrates a block diagram of a conventional phase locked loop circuit;

FIG. 2 illustrates a block diagram for a switched resistor phase locked loop circuit in accordance with U.S. Pat. No. 6,420,917;

DETAILED DESCRIPTION OF THE DRAWINGS

The current invention is an improved phase locked loop with a modified loop filter to prevent the erroneous condition in the charge pump. The instant invention also provides a sampling clock for the switched capacitor resistor circuitry of the loop filter.

Figure 3:
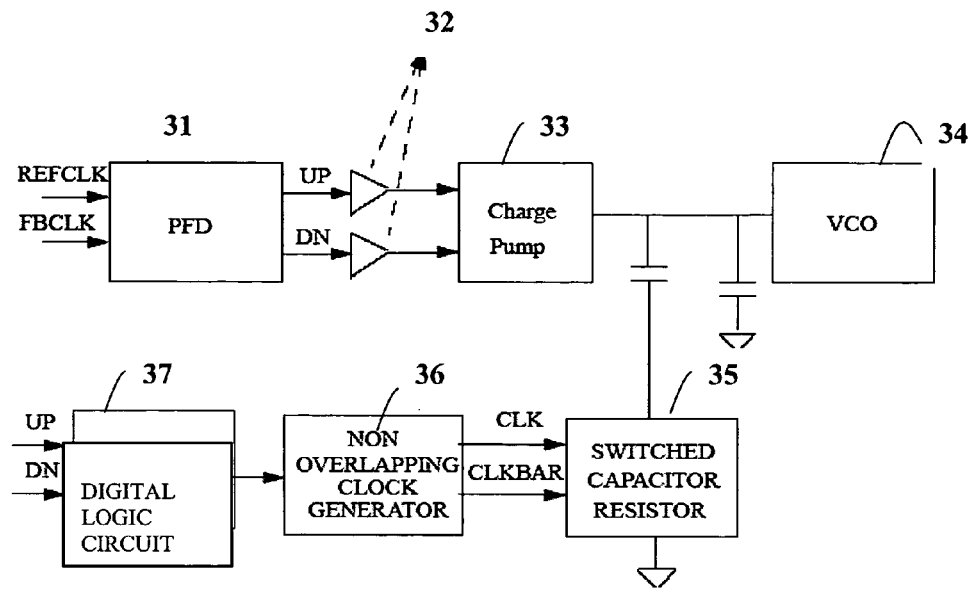
FIG. 3 illustrates a block diagram for the improved phase locked loop in accordance with instant invention.

FIG. 3 illustrates the improved PLL circuit of the instant invention. The PLL circuit comprises a phase frequency detector 31, a charge pump 33, a voltage controlled oscillator 34, switched capacitor resistor circuit for loop filter 35, non-overlapping clock generator 36, a digital logic circuit 37 and delay elements 32. Note that the feedback look is not shown (see, FIG. 1).

The phase frequency detector 31 receives REFCLK and FBCLK and generates charge pump control signals (up (UP) and down (DN) pulses). To ensure that the charge pump 33 charges/discharges the loop filter 35 only after the new set of non-overlapping clocks have been generated, delay cells 32 are introduced at the output from the PFD 31 to act on the UP and DN pulses. The delay cells 32 are, for example, OR gates with both their inputs coupled to receive the UP and DN pulses. The output of the charge pump 33 is coupled to a loop filter 35 with capacitors and the switched capacitor resistor circuitry 35. An OR gate is used with its input as UP and DN pulses and this circuit generates an output signal whose rising edges correspond to whichever of the two signals, UP or DN goes high first. The clock signal output from the digital logic circuit 37, which also receives UP and DN, is used to generate the non-overlapping clocks for the switched capacitor resistor 35. The output of the modified loop filter 35 is coupled to the voltage controlled oscillator 34. The frequency divider (not shown) in the PLL to obtain FBCLK for the phase frequency detector 31 divides the output of the voltage controlled oscillator 34.

Figure 4:
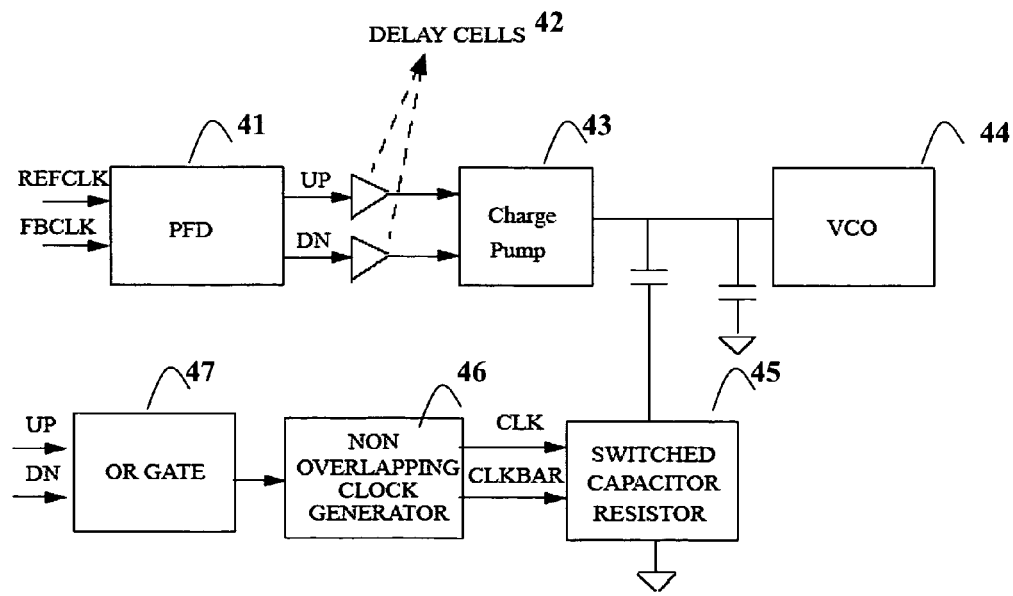
FIG. 4 illustrates a block diagram for an embodiment for the improved phase locked loop in accordance with instant invention.

FIG. 4 shows another embodiment wherein said digital logic circuit 47 is implemented using an OR gate.

The present invention is not to be limited in scope by the specific embodiments and examples, which are intended as illustrations of a number of aspects of the invention and any embodiments which are functionally equivalent are within the scope of this invention. Those skilled in the art will know, or be able to ascertain using no more than routine experimentation, many equivalents to the specific embodiments of the invention described herein. These and all other equivalents are intended to be encompassed by the following claims.

What is claimed is:

1. A phase-locked loop circuit, comprising:
    a phase-frequency detector for comparing the input signal with a feedback signal;
    a charge pump controlled by first and second control outputs from said phase-frequency detector,
    a switched-capacitor resistance based loop filter connected to the output of said charge pump;
    a voltage controlled oscillator connected to the output of said switched-capacitor resistance based loop filter with its output providing said feedback signal; and
    a sampling clock for driving said switched-capacitor resistance;
    wherein:
    delay elements for said first and second control outputs are introduced between said phase-frequency detector and said charge pump;

said sampling clock includes a set of non-overlapping clocks generated by a non-overlapping clock generator; and said non-overlapping clock generator is connected to receive from a digital logic circuit an output signal whose rising edges correspond to an earlier occurring rising edge of either of said first and second control outputs from said phase-frequency detector.

2. The circuit as claimed in claim 1 wherein said first and second control outputs are up and down signals.

3. The circuit as claimed in claim 1 wherein said delay elements are 2-input OR gate; each said OR gate have both their inputs coupled to each said first and second control outputs from said phase-frequency detector.

4. The circuit as claimed in claim 1 wherein said digital logic circuit is a 2-input OR gate having its inputs connected to said first and second control outputs from said phase-frequency detector.

5. A method for phase locking comprising:
   phase-frequency comparing the input signal with a feedback signal;
   generating first and second control outputs from the phase-frequency comparison;
   delaying said first and second control outputs;
   providing the delayed first and second control outputs to a charge pump;
   filtering an output of said charge pump;
   providing said feedback signal with respect to an output of said filtering; and
   generating a set of non-overlapping clocks whose rising edges correspond to an earlier occurring rising edge of either of said first and second control outputs.

6. A phase-locked loop circuit, comprising:
   a voltage controlled oscillator receiving a voltage control input and generating an oscillating output signal;
   a phase-frequency detector generating a first and second control output responsive to a comparison of a reference frequency signal to a feedback signal derived from the oscillating output signal;
   first and second delay circuits operable to delay the first and second control outputs;
   a charge pump circuit responsive to the delayed first and second control outputs to generate a control voltage;
   a switched capacitor-type loop filter receiving the control voltage and outputting the voltage control input; and
   a switching control circuit responsive to the first and second control outputs to generate signals for controlling operation of the switched capacitor-type loop filter.

7. The circuit of claim 6 wherein each delay circuit is a logic gate which logically combines the first and second control output.

8. The circuit of claim 6 wherein the switching control circuit includes a logic gate which logically combines the first and second control output and the signals for controlling operation of the switched capacitor-type loop filter are responsive to an output of the logic gate.

9. A phase-locked loop circuit, comprising:
   a voltage controlled oscillator receiving a voltage control input and generating an oscillating output signal;
   a phase-frequency detector generating a first and second control output responsive to a comparison of a reference frequency signal to a feedback signal derived from the oscillating output signal;
   a delay circuit for delaying the first and second control outputs;
   a charge pump circuit responsive to the delayed first and second control outputs to generate a control voltage;
   a switched capacitor-type loop filter receiving the control voltage and outputting the voltage control input; and
   a switching control circuit responsive to the first and second control outputs to generate signals for controlling operation of the switched capacitor-type loop filter.

10. A phase-locked loop circuit comprising:
    a voltage controlled oscillator receiving a voltage control input and generating an oscillating output signal;
    a phase-frequency detector generating a first and second control output responsive to a comparison of a reference frequency signal to a feedback signal derived from the oscillating output signal;
    a charge pump circuit responsive to the first and second control outputs to generate a control voltage;
    a switched capacitor-type loop filter receiving the control voltage and outputting the voltage control input;
    a switching control circuit responsive to the first and second control outputs to generate signals for controlling operation of the switched capacitor-type loop filter; and
    first and second delay circuits operable to delay the first and second control outputs, wherein the charge pump circuit is responsive to the delayed first and second control outputs.

11. The circuit of claim 10 wherein each delay circuit is a logic gate which logically combines the first and second control output.

12. The circuit of claim 9 wherein the switching control circuit includes a logic gate which logically combines the first and second control output and the signals for controlling operation of the switched capacitor-type loop filter are responsive to an output of the logic gate.

13. A method for phase locking comprising:
    delaying first and second phase frequency comparison output signals prior to application to a charge pump circuit which outputs a control voltage;
    loop filtering the control voltage with a switched capacitor-type loop filter to generate a voltage controlled oscillator control input signal; and
    generating clock signals driving operation of the switched capacitor-type loop filter wherein the generated clock signals are derived from the first and second phase frequency comparison output signals.

14. The method of claim 13 further comprising: phase frequency comparing a feedback signal derived from a voltage controlled oscillator output signal with a reference frequency signal to generate the first and second phase frequency comparison output signals.

* * * * *

UNITED STATES PATENT AND TRADEMARK OFFICE
CERTIFICATE OF CORRECTION

| | | |
|---|---|---|
| PATENT NO. | : 7,598,816 B2 | |
| APPLICATION NO. | : 11/638306 | |
| DATED | : October 6, 2009 | |
| INVENTOR(S) | : Nitin Agarwal et al. | |

It is certified that error appears in the above-identified patent and that said Letters Patent is hereby corrected as shown below:

In the Title Item (54):

Please replace the word [comparson] with the word -- comparison --

Signed and Sealed this
Thirty-first Day of May, 2011

David J. Kappos
*Director of the United States Patent and Trademark Office*

UNITED STATES PATENT AND TRADEMARK OFFICE
CERTIFICATE OF CORRECTION

PATENT NO.         : 7,598,816 B2
APPLICATION NO.    : 11/638306
DATED              : October 6, 2009
INVENTOR(S)        : Nitin Agarwal et al.

It is certified that error appears in the above-identified patent and that said Letters Patent is hereby corrected as shown below:

Title Page, Item (54) and at Column 1, line 3,

Please replace the word [comparson] with the word -- comparison --

This certificate supersedes the Certificate of Correction issued May 31, 2011.

Signed and Sealed this
Twenty-eighth Day of June, 2011

David J. Kappos
*Director of the United States Patent and Trademark Office*